(12) United States Patent
Yatsuda

(10) Patent No.: US 6,815,313 B2
(45) Date of Patent: Nov. 9, 2004

(54) ELECTRONIC COMPONENT TO BE MOUNTED ON A CIRCUIT BOARD HAVING ELECTRONIC CIRCUIT DEVICE SEALED THEREIN AND METHOD OF MANUFACTURING THE SAME

(75) Inventor: Hiromi Yatsuda, Mitaka (JP)

(73) Assignee: Japan Radio Co., Ltd., Tokyo (JP)

( * ) Notice: Subject to any disclaimer, the term of this patent is extended or adjusted under 35 U.S.C. 154(b) by 0 days.

(21) Appl. No.: 10/033,397

(22) Filed: Dec. 27, 2001

(65) Prior Publication Data

US 2002/0056897 A1 May 16, 2002

Related U.S. Application Data

(62) Division of application No. 09/583,382, filed on May 30, 2000, now Pat. No. 6,362,518.

(30) Foreign Application Priority Data

Jun. 2, 1999 (JP) .......................................... 11-155242
May 10, 2000 (JP) ...................................... 2000-137130

(51) Int. Cl.[7] ...................... H01L 21/301; H01L 21/78; H01L 21/60; H01L 21/58
(52) U.S. Cl. ...................... 438/458; 438/460; 438/613; 438/614; 438/113
(58) Field of Search ............................... 438/106, 107, 438/113, 458, 460, 613, 614, 108; 257/737, 738, 775, 779, 678, 684, 704, 773

(56) References Cited

U.S. PATENT DOCUMENTS

| | | | | |
|---|---|---|---|---|
| 5,311,402 A | * | 5/1994 | Kobayashi et al. | ......... 361/760 |
| 5,844,315 A | * | 12/1998 | Melton et al. | ............... 257/738 |
| 5,883,782 A | * | 3/1999 | Thurston et al. | ............. 361/704 |
| 5,949,137 A | * | 9/1999 | Domadia et al. | ............ 257/712 |
| 6,004,867 A | * | 12/1999 | Kim et al. | ................... 438/459 |
| 6,008,536 A | * | 12/1999 | Mertol | ......................... 257/704 |
| 6,077,757 A | * | 6/2000 | Mizuno et al. | .............. 438/465 |
| 6,180,435 B1 | * | 1/2001 | Ise et al. | ..................... 438/113 |
| 6,181,015 B1 | * | 1/2001 | Gotoh et al. | ................. 257/778 |
| 6,225,694 B1 | * | 5/2001 | Terui | .......................... 257/704 |
| 6,329,222 B1 | * | 12/2001 | Corisis et al. | .............. 438/118 |
| 6,596,560 B1 | * | 7/2003 | Hsu | ............................ 438/108 |
| 2001/0011857 A1 | * | 8/2001 | Morishima | .............. 310/313 R |
| 2002/0003459 A1 | * | 1/2002 | Yatsuda et al. | ............. 333/193 |
| 2002/0089256 A1 | * | 7/2002 | Taga | ....................... 310/313 R |

OTHER PUBLICATIONS

"Optimizing AQP SAW Resonators for Reduced Vibration Sensitivity", D. Andres, et al., 1995 IEE Ultrasonics Symposium pp. 177–182.
"Chip Size Packages As Thin As 0.3 mm Thick", at the top of P.10, Nikkei Electronics, Apr. 8 Issue, No. 659 and its English translation.

* cited by examiner

Primary Examiner—M. Wilczewski
(74) Attorney, Agent, or Firm—Gauthier & Connors LLP

(57) ABSTRACT

A first substrate has a plurality of bumps and a second substrate has a plurality of openings at positions in registration with the plurality of bumps when the first and second substrates are placed one on top of the other in a confronting manner. The first and second substrates are put together by fusing a sealing wall formed on the second substrate, to hermetically seal an electronic device lying on the first substrate therein. Gas that may be generated upon fusing of the sealing wall can be effectively removed through the openings in the second substrate.

7 Claims, 16 Drawing Sheets

ELECTRONIC COMPONENT TO BE MOUNTED ON A CIRCUIT BOARD HAVING ELECTRONIC CIRCUIT DEVICE SEALED THEREIN AND METHOD OF MANUFACTURING THE SAME

This application is a divisional of application Ser. No. 09/583,382 filed May 30, 2000, now U.S. Pat. No. 6,362,518, which claims priority to Japanese Application Nos. Hei 11-155242 filed Jun. 2, 1999 and 2000-137130 filed on May 10, 2000.

BACKGROUND OF THE INVENTION

1. Field of the Invention

The present invention relates generally to an electronic component having an electronic circuit device sealed therein and a method of manufacturing the same, and, more particularly, to an electronic component to be mounted on a circuit board and having a surface acoustic wave device or a semiconductor integrated circuit device sealed therein, as well as to a method of manufacturing the same.

2. Description of the Related Arts

Electronic appliances use a multiplicity of electronic components in each of which is hermetically sealed an electronic circuit device such as a semiconductor integrated circuit device or a surface acoustic wave (hereinafter, referred to as SAW) device. Such a multiplicity of electronic components are mounted on a single circuit board. Recent electronic appliances have a tendency toward miniaturization and low prices. This necessitates miniaturized and low-priced electronic components for use therein. Prevailing electronic components often employ a typical structure in which the electronic circuit device is sealed in a ceramic or metal package. However, in order to achieve further miniaturization and low prices there have been proposed electronic components making use of substrates themselves formed with electronic circuit devices for sealing of the electronic circuit devices.

Referring to FIGS. 20A and 20B, an electronic component is shown having a structure that is disclosed in "Optimizing AQP SAW Resonators for Reduced Vibration Sensitivity" published in IEEE Ultrasonic Symposium, 1995. FIG. 20A is a side elevation of an electronic component 110; and FIG. 20B is a sectional view of the same taken along a line A—A of FIG. 20A. The electronic component 110 is an SAW resonator. The SAW resonator includes comb-shaped electrodes 116, 118, 120 and 122 that are formed on a main surface 114 of an SAW substrate 112. A glass sealing wall 126 is formed on a quartz substrate 124 and is fused to the main surface 114 of the SAW substrate 112. The sealing wall 126 is formed so as to enclose an SAW device formed on the SAW substrate 112. The SAW device is hermetically sealed by the SAW substrate 112, quartz substrate 124 and sealing wall 126. The comb-shaped electrodes 116, 118, 120 and 122 extend beyond the sealing wall 126 so that their extremities, i.e., electrodes pads 128, 130, 132 and 134 are connected via bonding wires not shown to a circuit board not shown. In the step of assembling such two substrates into the electronic component 110, the assembly is typically carried out for each electronic component.

When fabricating the electronic component 110 depicted in FIGS. 20A and 20B, the sealing wall 126 may be heated upon fusing of the sealing wall 126 made of glass, polyimide resin or epoxy resin onto the main surface 114 of the SAW substrate 112, with the result that gas may be generated at the sealing wall fused portion. The thus generated gas may possibly attach to the SAW device electrodes inside the sealing wall, resulting in degradation of the SAW device characteristics.

SUMMARY OF THE INVENTION

The present invention was conceived in order to overcome the above problems. It is therefore the object of the present invention to provide an electronic component having a structure capable of effective removal of gas that may be generated upon the fusion of sealing walls.

According to a first aspect of the present invention there is provided an electronic component to be mounted a circuit board comprising a first substrate having an electronic circuit device and an electrode pad on one main surface of the first substrate in electric connection with the electronic circuit device; a sealing wall whose one face is closely adhered to the one main surface of the first substrate, the sealing wall being configured to enclose the electronic circuit device with the electrode pad arranged outside of the sealing wall; a second substrate closely adhered to the other face of the sealing wall; an opening formed in the second substrate at a site confronting the electrode pad; and an electrically conductive member extending through the interior of the opening for electrical connection with the electrode pad.

In the electronic component of the present invention, the electrically conductive member may comprise a bump disposed on the electrode pad.

In the electronic component of the present invention, the electrically conductive member may comprise a first bump disposed on the electrode pad for electrical connection with the electrode pad; and a second bump disposed on top of the first bump for electrical and physical connection with the circuit board.

In the electronic component of the present invention, the electrically conductive member may comprise a first bump disposed on the electrode pad for electrical connection with the electrode pad; and a second bump disposed on top of the first bump for electrical and physical connection with the circuit board; the first bump being a gold bump, the second bump being a solder bump.

In the electronic component of the present invention, the second substrate may have a second sealing wall around the opening configured to enclose the electrically conductive member.

In the electronic component of the present invention, the electrically conductive member may comprise a first electrically conductive member disposed on an inner wall of the opening for being electrically and physically connectable to the circuit board; and a second electrically conductive member disposed on the electrode pad for being electrically connected with the first electrically conductive member and with the electrode pad.

In the electronic component of the present invention, the electrically conductive member may comprise a first electrically conductive member disposed on an inner wall of the opening for being electrically and physically connectable to the circuit board; and a second electrically conductive member disposed on the electrode pad for being electrically connected to the first electrically conductive member and to the electrode pad. The second substrate may be a multi-layer substrate carrying one or more circuit elements thereon. In this case, the circuit element can be an element such as an inductor, a capacitor or a resistor having certain electrical characteristics and capable of being connected to other elements to form a circuit. The multi-layer substrate can be, for example, one having a structure in which a plurality of insulating layers and electrically conducting layers are disposed one on top of the other.

In the electronic component of the present invention, the sealing wall may be made of an insulating material, the material having an adhesion to at least one of the first substrate and the second substrate. The sealing wall may be made of a material selected from a group consisting of glass, polyimide resin and epoxy resin.

In the electronic component of the present invention, the electronic circuit device may be a surface acoustic wave device.

In the electronic component of the present invention, the first and second substrates may be made of the same material.

According to a second aspect of the present invention there is provided a method of manufacturing an electronic component, the electronic component to be mounted on a circuit board comprising a first substrate having on its one main surface an electronic circuit device and an electrode pad in electric connection with the electronic circuit device; a sealing wall whose one face is closely adhered to the one main surface of the first substrate, the sealing wall being configured to enclose the electronic circuit device with the electrode pad arranged outside of the sealing wall; a second substrate closely adhered to the other face of the sealing wall; an opening formed in the second substrate at a site confronting the electrode pad; and an electrically conductive member extending through the interior of the opening for allowing the electrode pad and the circuit substrate to be electrically connectable to each other; the method comprising a first step in which one face of each of a plurality of sealing walls is closely adhered to one main surface of the first substrate which has on the one main surface a plurality of electronic circuit devices formed in a plurality of circuit regions and a plurality of electrode pads in electric connection with the plurality of electronic circuit devices, the plurality of sealing walls each configured to enclose each of the plurality of electronic circuit devices with each of the plurality of electrode pads arranged outside of each of the plurality of sealing walls, and in which the second substrate is closely adhered to the other faces of the plurality of sealing walls, the second substrate having a plurality of openings at sites confronting the plurality of electrode pads; a second step in which an electrically conductive member is formed on each of the plurality of electrode pads, the electrically conductive member being in electric connection with each of the plurality of electrode pads; and a third step in which the first substrate, together with the second substrate, is severed for each of the plurality of circuit regions, to obtain a plurality of electronic components.

In the electronic component manufacturing method of the present invention, the first step may include a step in which the plurality of sealing walls are closely adhered to the first substrate after formation of the plurality of sealing walls on the second substrate, or alternatively it may include a step in which the plurality of sealing walls are closely adhered to the second substrate after formation of the plurality of sealing walls on the first substrate.

In the electronic component manufacture method of the present invention, the second step may include a step in which the electrically conductive member is formed on each of the plurality of electrode pads through a corresponding one of the plurality of openings.

In the electronic component manufacture method of the present invention, the electrically conductive member may comprise a bump.

In the electronic component manufacture method of the present invention, the electrically conductive member may comprise a first bump disposed on each of the plurality of electrode pads for electrical connection with the each of the plurality of electrode pads; and a second bump disposed on top of the first bump for electrical and physical connection with the circuit board. The second step may include a step in which the first bump is formed on each of the plurality of electrode pads through a corresponding one of the plurality of openings, after which the second bump is formed on top of the first bump.

In the electronic component manufacture method of the present invention, the first electrically conductive member may previously be formed on an inner wall of each of the plurality of openings, the first electrically conductive member being electrically connectable to the circuit board, and the second step may include a step in which a second electrically conductive member is formed on each of the plurality of electrode pads, the second electrically conductive member electrically connecting the first electrically conductive member and each of the plurality of electrode pads.

In the electronic component manufacture method of the present invention, the second step may be carried out posterior to the first step.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENTS

Figure 1A:
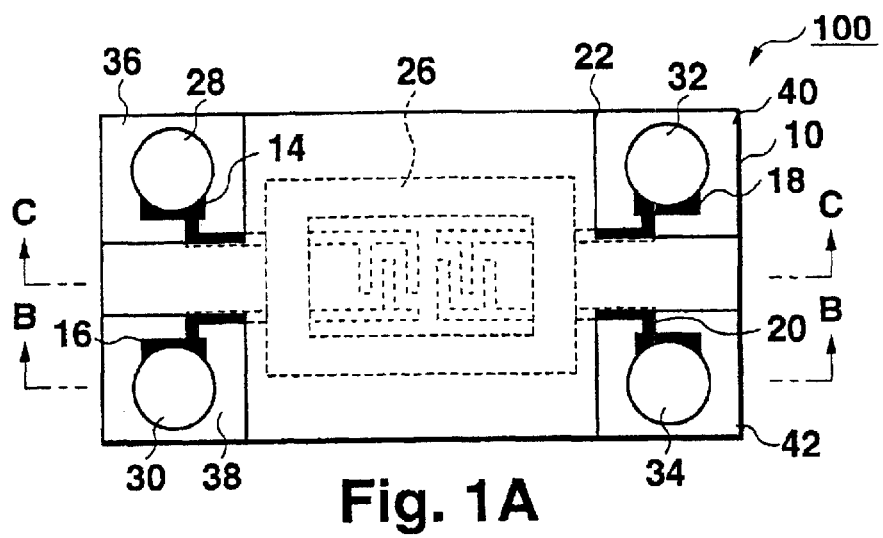
FIG. 1A is a top plan view of an electronic component 100 of an embodiment of the present invention.

A preferred embodiment of the present invention will now be described with reference to the accompanying drawings in which the same reference numerals designate identical or corresponding parts throughout several views.

In the embodiment, an exemplary case is shown where an electronic circuit device hermetically sealed in an electronic component is an SAW device. However, the electronic component of the embodiment would be applicable to any electronic components in which a variety of electronic circuit devices such as semiconductor integrated circuit devices are sealed.

Figure 1B:
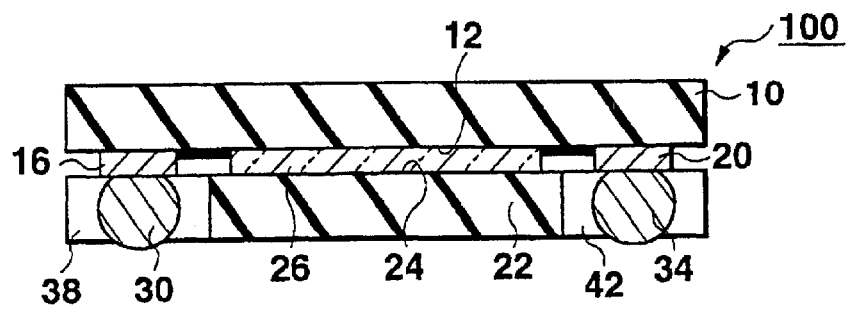
FIG. 1B is a sectional view of the electronic component 100 shown in FIG. 1A, taken along a line B—B of FIG. 1A.
Figure 1C:
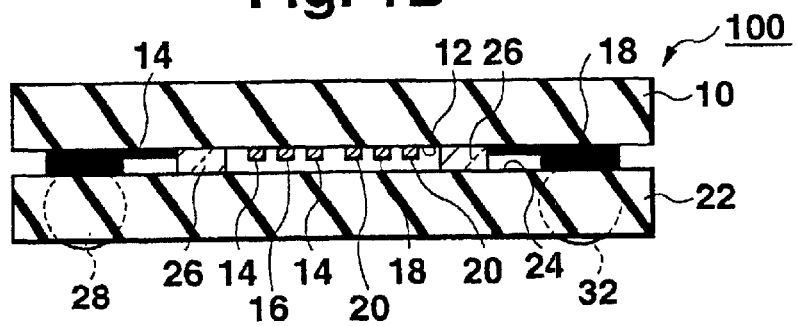
FIG. 1C is a sectional view of the electronic component 100 shown in FIG. 1A, taken along a line c—c of FIG. 1A.

FIG. 1A is a top plan view of the electronic component of the embodiment; FIG. 1B is a sectional view of the same taken along a line B—B of FIG. 1A; and FIG. 1C is a sectional view of the same taken along a line C—C of FIG. 1A. A substrate 10 is an SAW substrate and comprises an SAW device consisting of comb-shaped electrodes 14, 16, 18 and 20 that are formed on a main surface 12. A substrate 22 is provided confronting the substrate 10. The substrate 22 has a sealing wall 26 formed on a main surface 24 thereof. The sealing wall 26 has a contour enclosing the SAW device formed on the substrate 10, i.e., a contour enclosing the comb-teeth portions of the comb-shaped electrodes 14, 16, 18 and 20. The sealing wall 26 is adhered to the main surface 12 of the substrate 10 so that the SAW device is hermetically sealed by the substrates 10, 22 and the sealing wall 26.

The comb-shaped electrodes 14, 16, 18 and 20 of the SAW device are electrically connected to bumps 28, 30, 32 and 34, respectively, formed on the main surface 12 of the substrate 10 and at sites (hereinafter referred to as electrode pads) lying outside the sealing wall 26. The substrate 22 is provided with openings 36, 38, 40 and 42 that are positioned so as to be in alignment with the bumps 28, 30, 32 and 34, respectively. The bumps 28, 30, 32 and 34 are exposed to the exterior from the openings 36, 38, 40 and 42, respectively.

Figure 2:
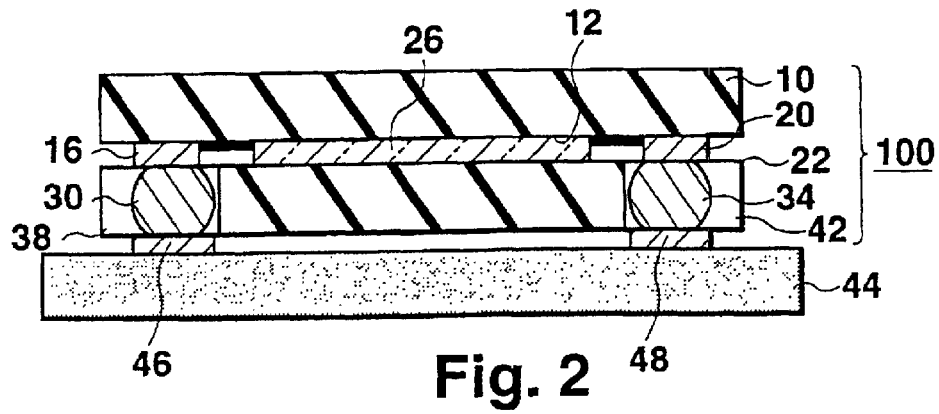
FIG. 2 is a sectional view of the electronic component 100 being mounted on a circuit board.

Referring to FIG. 2, the status of the electronic component 100 being mounted on a circuit board 44 is shown. The bump 30 on the substrate 10 is connected to an electrode 46 placed on the circuit board 44, and the bump 34 is connected to an electrode 48 placed on the circuit 44. Similarly, the remaining bumps are also connected to electrodes, not shown, on the circuit board 44. In this manner, via the bumps the electronic component 100 is electrically connected to and mounted on the circuit board 44. At that time, the bumps 30 and 34 may be joined to the electrodes 46 and 48 on the circuit board 44 by way of electrically conductive resin, solder or the like.

The electronic component of the first embodiment is connected to the circuit board by use of the bumps. Thus, compared with the conventional electronic component using bonding wires for the connection to the circuit board, the area occupied by the electronic component on the circuit board is reduced so that high density mounting is feasible.

In addition, the SAW device is hermetically sealed by the two substrates and the sealing wall without the use of packages of ceramics, etc. This reduces the number of elements, making it possible to provide inexpensive electronic components.

Description will now be given of a method of fabricating the electronic component of the embodiment.

Figure 3A:
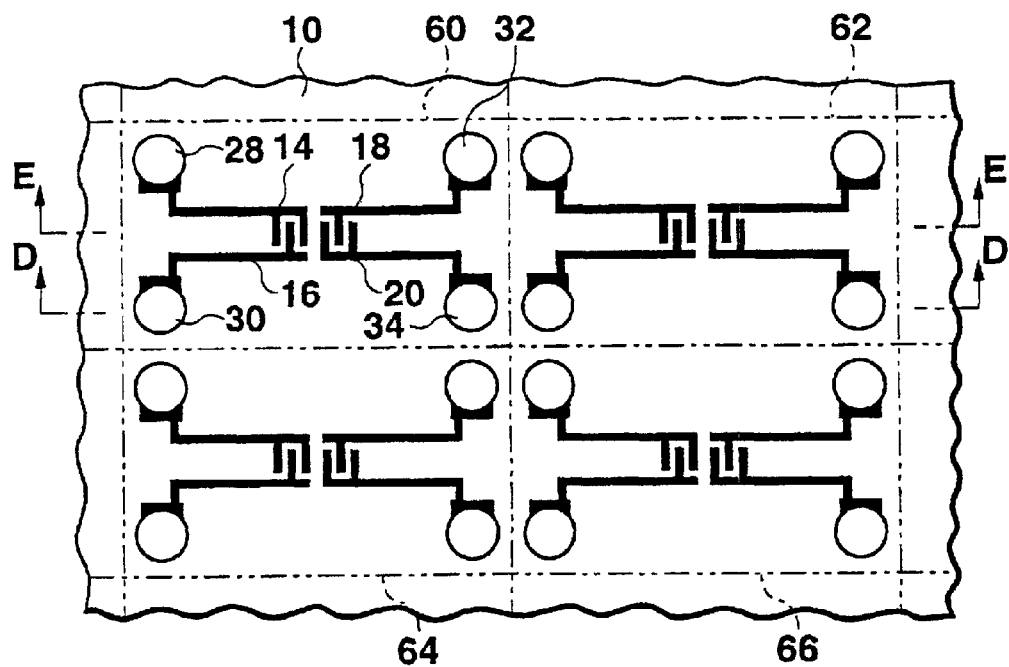
FIG. 3A is a top plan view of the substrate 10 having SAW devices formed thereon before being assembled.
Figure 3B:
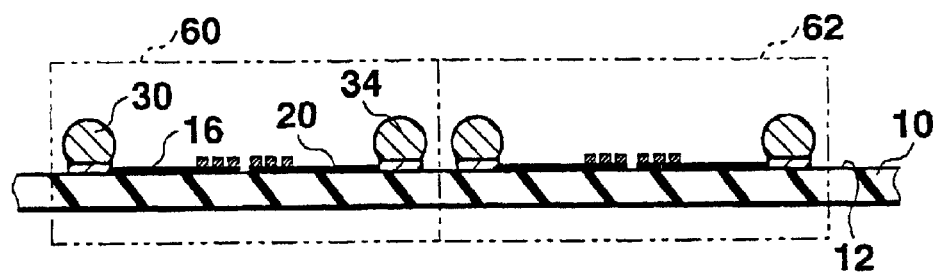
FIG. 3B is a sectional view of the substrate shown in FIG. 3A, taken along a line D—D of FIG. 3A.
Figure 3C:
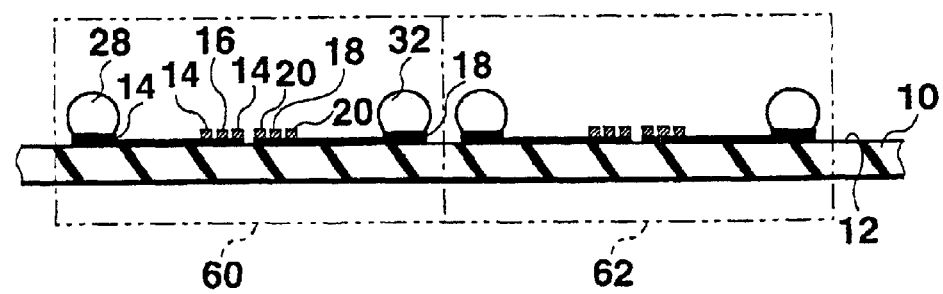
FIG. 3C is a sectional view of the substrate shown in FIG. 3A, taken along a line E—E of FIG. 3A.

FIG. 3A is a top plan view of the substrate having the SAW device formed thereon before being assembled; FIG. 3B is a sectional view of the same taken along a line D—D of FIG. 3A; and FIG. 3C is a sectional view of the same taken along a line E—E of FIG. 3A. In a circuit region 60 on the substrate 10 the SAW device consisting of the comb-shaped electrodes 14, 16, 18 and 20 is formed. Similarly, SAW devices are respectively formed in circuit regions 62, 64 and 66. In the subsequent step, the substrate 10 is separated into a plurality of circuit regions each providing a single electronic component. The bumps 28, 30, 32 and 34 that are connected to electrodes of the SAW device are formed in the circuit region 60. The bumps 28, 30, 32 and 34 are formed in the circuit region 60 so as to be positioned outside of the sealing wall that is adhered to the substrate 10 in the later step. In the interiors of the other circuit regions the bumps are formed in the same manner as in the interior of the circuit region 60.

Figure 4A:
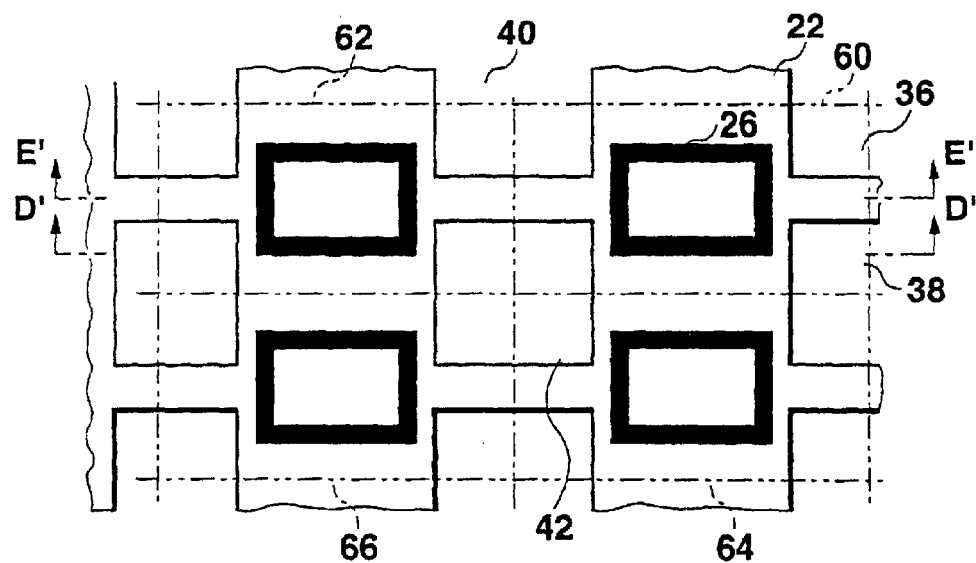
FIG. 4A is a top plan view of the substrate having sealing walls formed thereon before being assembled.
Figure 4B:
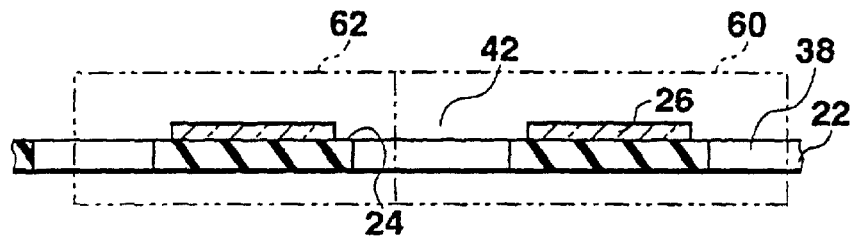
FIG. 4B is a sectional view of the substrate of FIG. 4A taken along a line D'—D' of FIG. 4A.
Figure 4C:
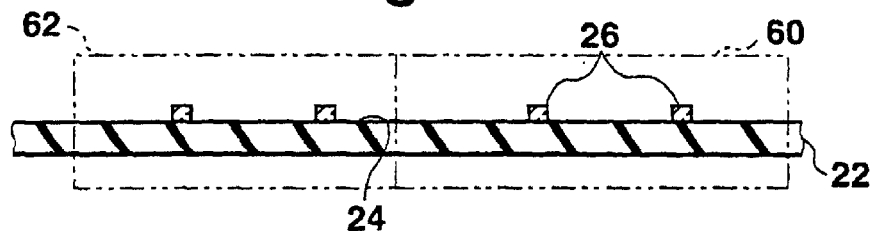
FIG. 4C is a sectional view of the substrate of FIG. 4A taken along a line E'—E' of FIG. 4A.

FIG. 4A is a top plan view of the unassembled substrate having the sealing wall formed thereon before being assembled; FIG. 4B is a sectional view of the same taken along a line D'—D' of FIG. 4A; and FIG. 4C is a sectional view of the same taken along a line E'—E of FIG. 4A.

The sealing wall 26 is formed in the circuit region 60 on the substrate 22. Similarly, the sealing wall is formed in the other circuit regions as well. The sealing wall is made of a material having a low electric conductivity such as glass, polyimide resin, epoxy resin, etc. The sealing wall 26 extends so as to enclose the SAW device on the substrate 10 and to allow the bumps 28, 30, 32 and 34 to lie outside of the sealing wall 26 when the substrate 10, shown in FIGS. 3A, 3B and 3C, is made to confront the substrate 22 in the later step.

The substrate 22 is provided with the plurality of openings 36, 38, 40 and 42 that are positioned so as to confront the bumps on the substrate 10 when the substrate 10 shown in FIGS. 3A to 3C is made to confront the substrate 22.

Figure 5:
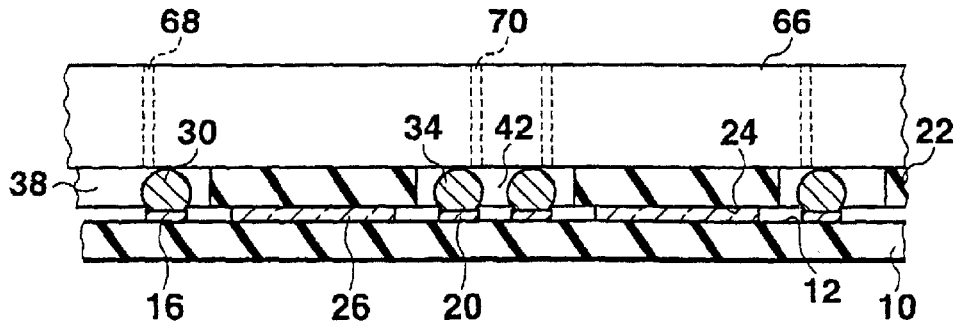
FIG. 5 is a schematic view of the state of a step of assembling the substrate 10 whose the SAW device is formed in the main surface and the substrate 22 whose the sealing walls are formed on the main surface.

Then, as shown in FIG. 5, with the main surface 12 of the substrate 10 confronting the main surface 24 of the substrate 22, the sealing wall 26 is pressed against the substrate 10 by pressure means 66 while heating the substrate 22 so that the sealing wall 26 can adhere to the substrate 10. Heating allows a part of the sealing wall 26 to fuse and adhere to the substrate 10. It is to be noted that heating is carried out at a temperature sufficient to allow the sealing wall 26 to fuse and adhere to the substrate 10 and at a temperature sufficient to allow the sealing wall 26 to keep its shape sufficiently to support the substrate 22. When the sealing wall 26 fuses to the substrate 10, gas will be generated. The gas can be effectively removed through the openings 36, 38, 40 and 42 in the substrate 22. The pressure means 66 are provided with through-holes 68 and 70 through which the generated gas can be effectively discharged to the exterior of the electronic component.

Figure 6A:
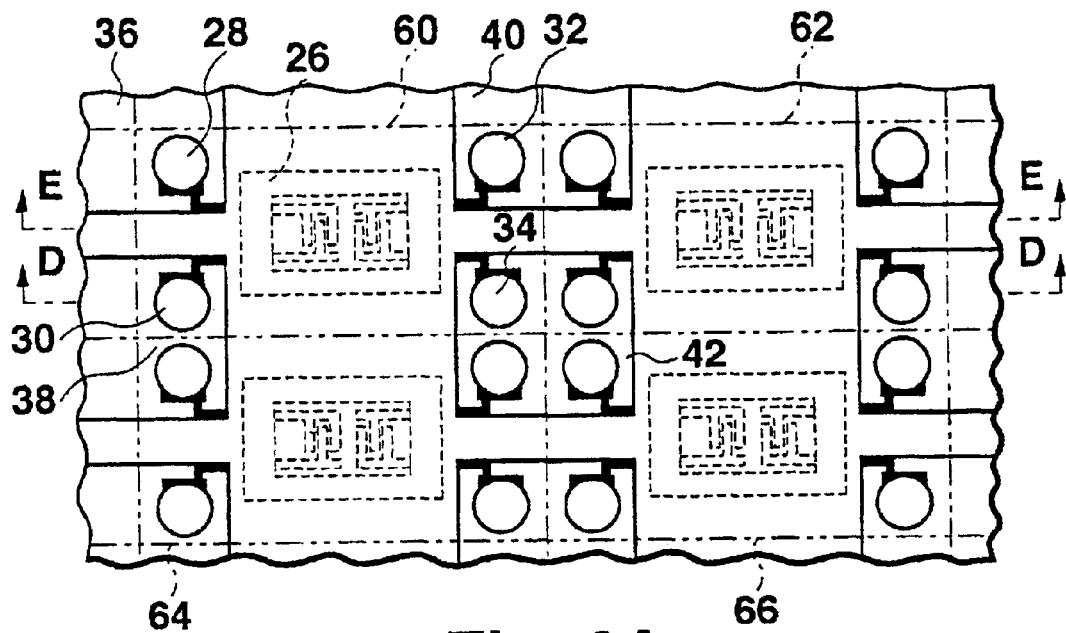
FIG. 6A is a top plan view of a substrate 10 and a substrate 22 that have been assembled together.
Figure 6B:
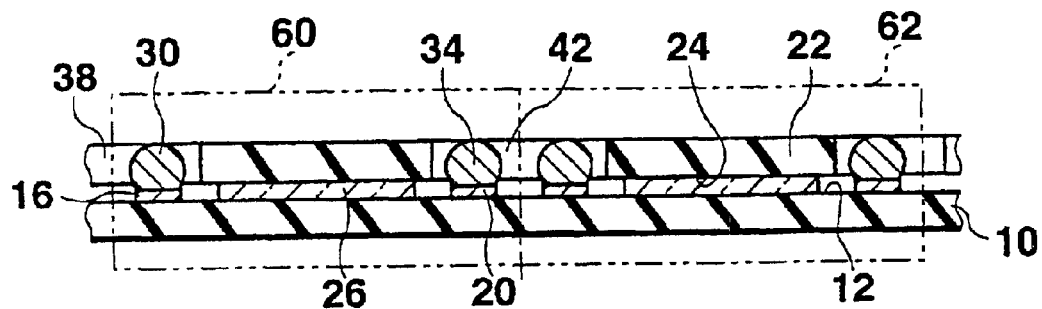
FIG. 6B is a sectional view of the assembled substrates 10 and 22 of FIG. 6A, taken along a line D—D of FIG. 6A.
Figure 6C:
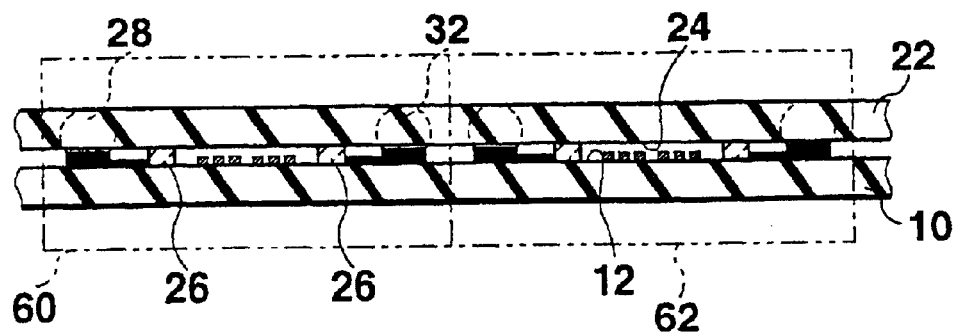
FIG. 6C is a sectional view of the assembled substrates 10 and 22 of FIG. 6A, taken along a line E—E of FIG. 6A.

FIG. 6A is a top plan view of the substrate 10 and the substrate 22 which have been assembled together; FIG. 6B is a sectional view of the same taken along a line D—D of FIG. 6A; and FIG. 6C is a sectional view of the same taken along a line E—E of FIG. 6A. In the assembled status, the line D—D of FIG. 3A coincides with the line D'—D' of FIG. 4A, which are designated in common as the line D—D in FIG. 6A. Similarly, the line E—E of FIG. 3A and the line E'—E' of FIG. 4A are designated in common as the line E—E in FIG. 6A. After the assembly, the bumps 28, 30, 32 and 34 are exposed to the exterior through the substrate openings 36, 38, 40 and 42, respectively. After assembly, the substrate 10 and the substrate 22 are severed into a plurality of circuit regions to obtain a plurality of electronic components as shown in FIGS. 1A to 1C.

In this manner, the electronic component manufacturing method of the embodiment can obtain a plurality of electronic components through a single assembling operation. Thus, compared with the case of individual assembly, the number of manufacturing steps can be reduced to a large extent, making it possible to lower the cost of each electronic component.

Figure 7:
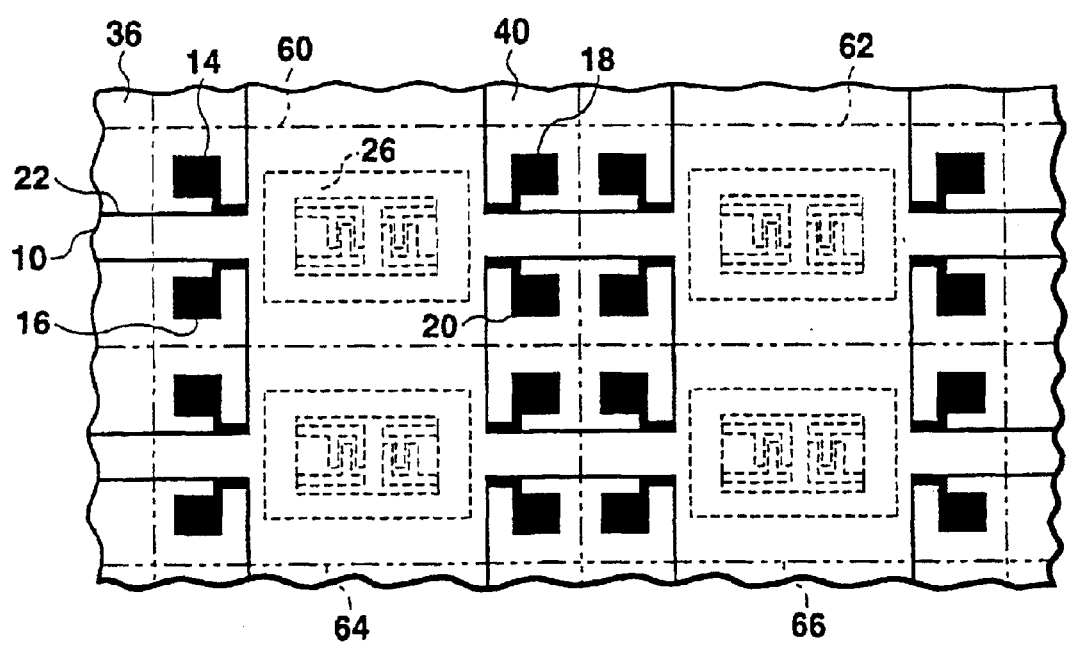
FIG. 7 is a schematic view showing the state where prior to the bump formation, comb-shaped electrodes are exposed to the exterior through openings, in a step of forming the bumps after the adhesion of the sealing walls to the substrate having the SAW devices formed thereon.

In the electronic component manufacturing method of the embodiment, after the formation of the bumps 28, 30, 32 and 34 on the substrate 10, the sealing wall 26 of the substrate 22 was heated and fused to the substrate 10. Instead, before the formation of the bumps 28, 30, 32 and 34 on the substrate 10, the sealing wall 26 of the substrate 22 may be fused to the substrate 10. In this case, the sealing wall 26 of the substrate 22 shown in FIGS. 4A to 4C is adhered to the substrate 10 having no bumps thereon previous to the adhesion of the sealing wall 26. FIG. 7 is a top plan view of the status where the sealing wall 26 of the substrate 22 is adhered to the substrate 10. At that time, the comb-shaped electrodes 14, 16, 18 and 20 are exposed to the exterior through the openings 36, 38, 40 and 42 in the substrate 22. Bumps are formed on top of the thus exposed comb-shaped electrodes 14, 16, 18 and 20 through the associated openings. At that time, the SAW device of the substrate 10 is hermetically sealed by the substrate 10, sealing wall 26 and substrate 22 prior to the formation of the bumps. For this reason, even when the bumps are formed by means of electroplating or flux, the plating or flux are prevented from entering specific portions of the comb-shaped electrodes 14, 16, 18 and 20 constituting the SAW device so that the formation of bumps can be facilitated.

Furthermore, the formation of the bumps on electrode pads enables the adhesion of the sealing wall to be effected at a higher temperature than the fusing temperature.

Additionally, the bumps are exposed to the exterior through the openings in the electronic component of the embodiment so that second bumps can be easily disposed on top of the bumps formed on the substrate.

Figure 8A:
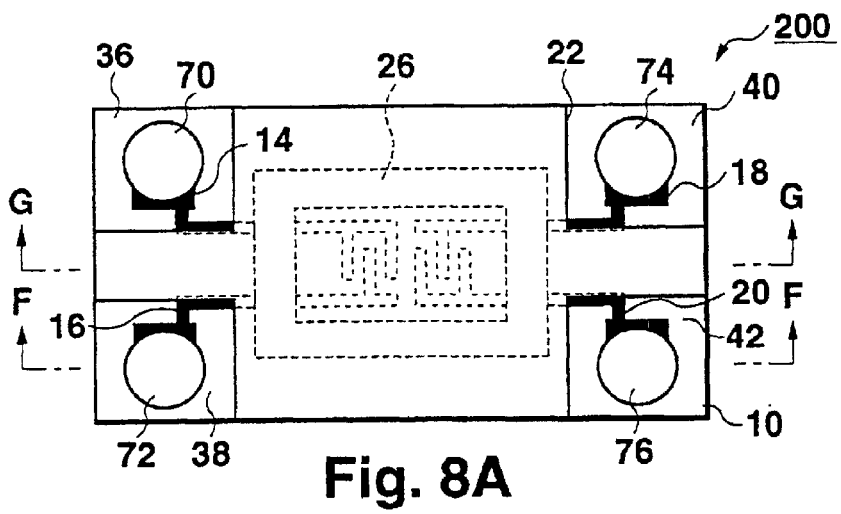
FIG. 8A is a top plan view of an electronic component having second bumps formed on top of the existing bumps.
Figure 8B:
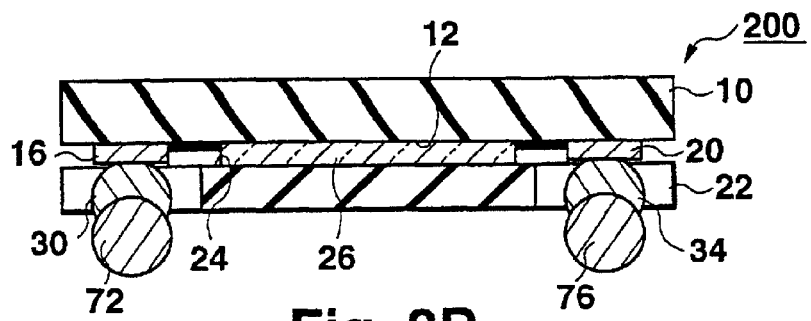
FIG. 8B is a sectional view of the electronic component of FIG. 8A taken along a line F—F of FIG. 8A.
Figure 8C:
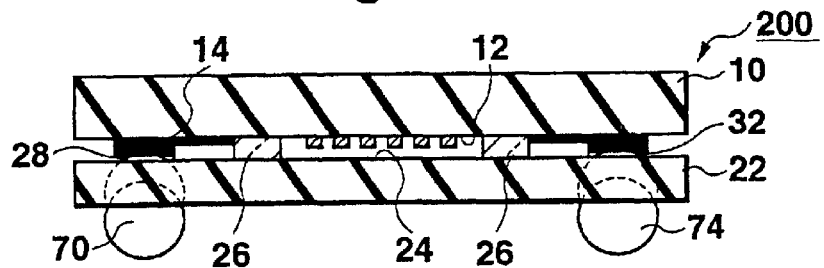
FIG. 8C is a sectional view of the electronic component of FIG. 8A taken along a line G—G of FIG. 8A.

FIG. 8A is a top plan view of an electronic component in which second bumps are disposed on top of the bumps; FIG. 8B is a sectional view of the same taken along a line F—F of FIG. 8A; and FIG. 8C is a sectional view of the same taken along a line G—G of FIG. 8A. The second bumps 70, 72, 74 and 76 are disposed in the status shown in FIGS. 6A, 6B and 6C where the substrate 10 and the substrate 22 have been assembled together. By dropping the second bumps through the opening in the substrate 22, the second bumps, e.g., solder bumps are disposed on top of the bumps on the substrate 10, both of which are then heated so that they are joined together. The bumps 28, 30, 32 and 34 previously placed on the substrate are exposed to the exterior through the openings 36, 38, 40 and 42, respectively. This facilitates the disposition of the second bumps 70, 72, 74 and 76 on top of the bumps 28, 30, 32 and 34, respectively. After the disposition of the second bumps 70, 72, 74 and 76 on top of the bumps 28, 30, 32 and 34, respectively, the substrates 10 and 22 are jointly severed into a plurality of circuit regions, to obtain a plurality of electronic components through a single assembling operation.

Figure 9:
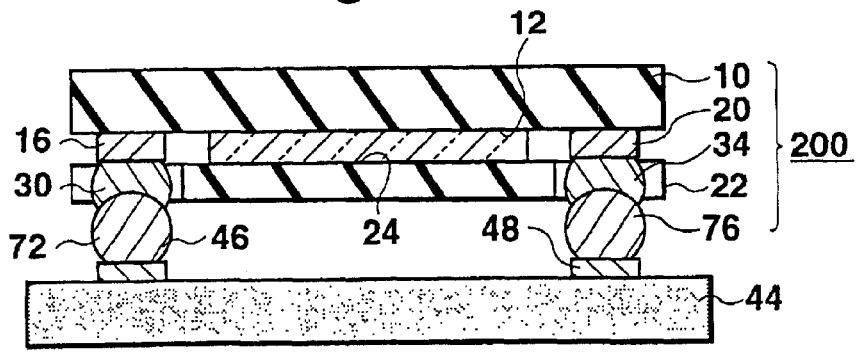
FIG. 9 is a sectional view of an electronic component in accordance with another embodiment being mounted on the circuit board.

FIG. 9 illustrates the status where the circuit board is mounted with an electronic component 200 having two-stage bumps. By employing such a two-stage bump structure, the second bumps 70, 72, 74 and 76 can protrude from the substrate 22 even though the substrate 22 is of a greater thickness, and the electronic components can be mounted on the circuit board in a suitable manner.

The electronic component 200 having a two-stage bump structure is useful for the connection when the comb-shaped electrodes 14, 16, 18 and 210 on the substrate 10 are made of a material different from that of the electrodes 46, 48, etc., of the circuit board 44.

For example, in cases where the material of the comb-shaped electrodes 14, 16, 18 and 20 on the substrate 10 is aluminum and the material of the electrodes 46, 48, etc., of the circuit board 44 is solder plating, it is preferable that the bumps 28, 30, 32 and 34 be made of gold but that the second bumps 70, 72, 74 and 76 be solder bumps. In such a case, by virtue of the second bumps 70, 72, 74 and 76 in the form of the solder bumps, easy connection is ensured even though the electrodes 46 and 48 are made of solder plating which is less likely to connect with gold. In this manner, the two-stage bump structure allows the materials of the bumps 28, 30, 32 and 34 and of the second bumps 70, 72, 74 and 76 to be appropriately selected, in compliance with the materials of the comb-shaped electrodes 14, 16, 18 and 20 and the electrodes 46, 48, etc., of the circuit board 44, thereby making it possible to obtain a good connection.

Figure 10A:
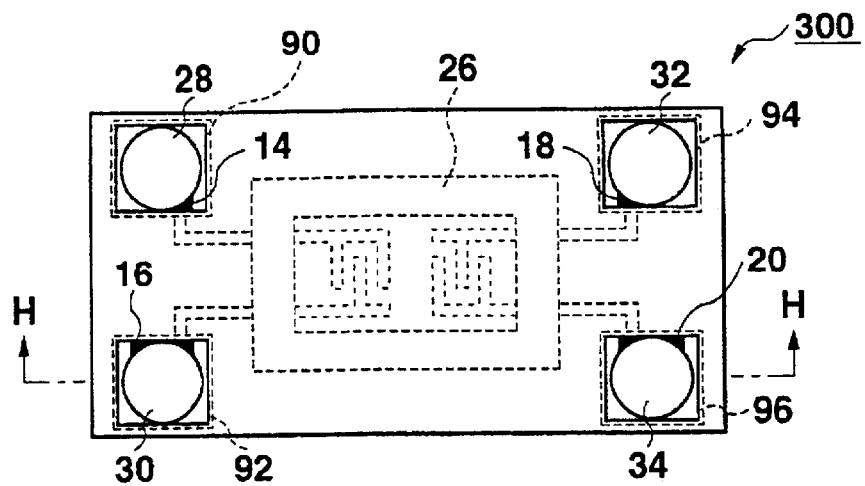
FIG. 10A is a top plan view of an electronic component having second sealing walls enclosing the bumps.
Figure 10B:
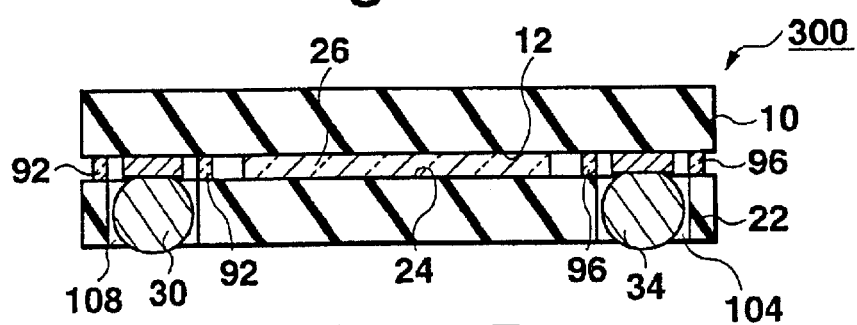
FIG. 10B is a sectional view of the electronic component of FIG. 10A taken along a line H—H of FIG. 10A.

Alternatively, second sealing walls may be provided so as to enclose the bumps at the periphery of the openings on the substrate 22. FIG. 10A is a top plan view of an electronic component having the second sealing walls each enclosing the bump; and FIG. 10B is a sectional view of the same taken along a line H—H of FIG. 10A. The sealing wall 26 and second sealing walls 90, 92, 94 and 96 are formed on the substrate 22. The contours of the second sealing walls 90, 92, 94 and 96 are such that the bumps of the substrates 10 are each enclosed by the associated second sealing walls when the substrate 10 is made to confront the substrate 22. It is preferred that the second sealing walls be made of the same material as that of the sealing wall 26. The formation of the second sealing walls 90, 92, 94 and 96 precedes the assembly of the substrates 10 and 22.

Figure 11:
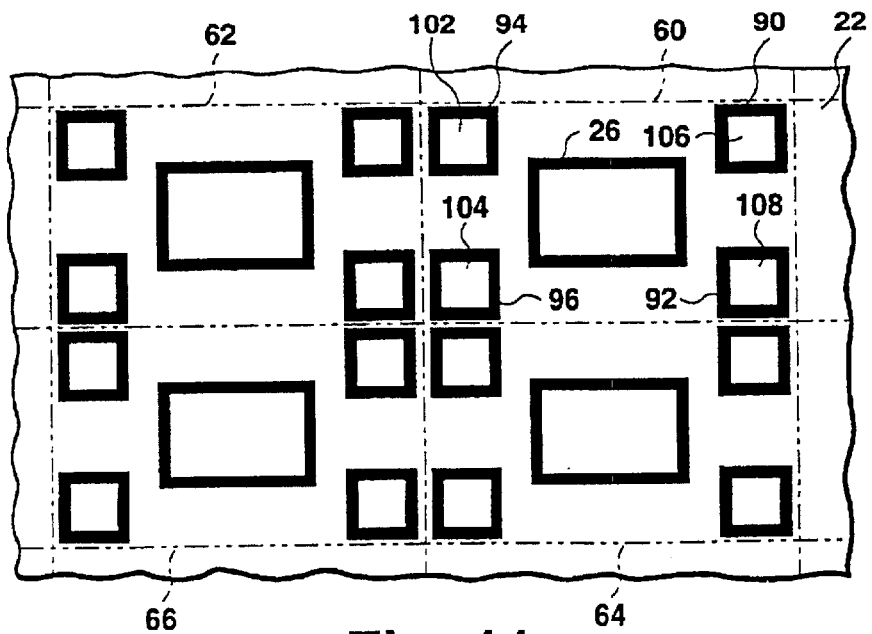
FIG. 11 is a schematic view of an unassembled substrate whose sealing wall and second sealing walls are formed on the main surface.

FIG. 11 is a top plan view of the substrate 22 having the second sealing walls before being assembled. A circuit region 60 on the substrate 22 is provided with openings 102, 104, 106 and 108. The sealing wall 26 and the second sealing walls 90, 92, 94 and 96 that enclose the openings 102, 104, 106 and 108, respectively, are formed in the circuit region 60 on the substrate 22. The openings, sealing wall and second sealing walls are similarly formed in the other circuit regions 62, 66 and 64 as well. After the adhesion of the sealing wall 26 and second sealing walls 90, 92, 94 and 96 to the substrate 10 shown in FIGS. 3A to 3C, the substrate 10 and 22 is severed into a plurality of circuit regions so that a plurality of electronic components are manufactured at a time. The electronic component equipped with the second sealing walls prevents flux or the like from entering the substrate 10 when the bumps 28, 30, 32 and 34 are connected to the circuit board 44. Furthermore, when assembling the substrates 10 and 20 together, a stricter parallel relationship can be achieved in the assembly of the substrate 10 and the substrate 22.

Figure 12A:
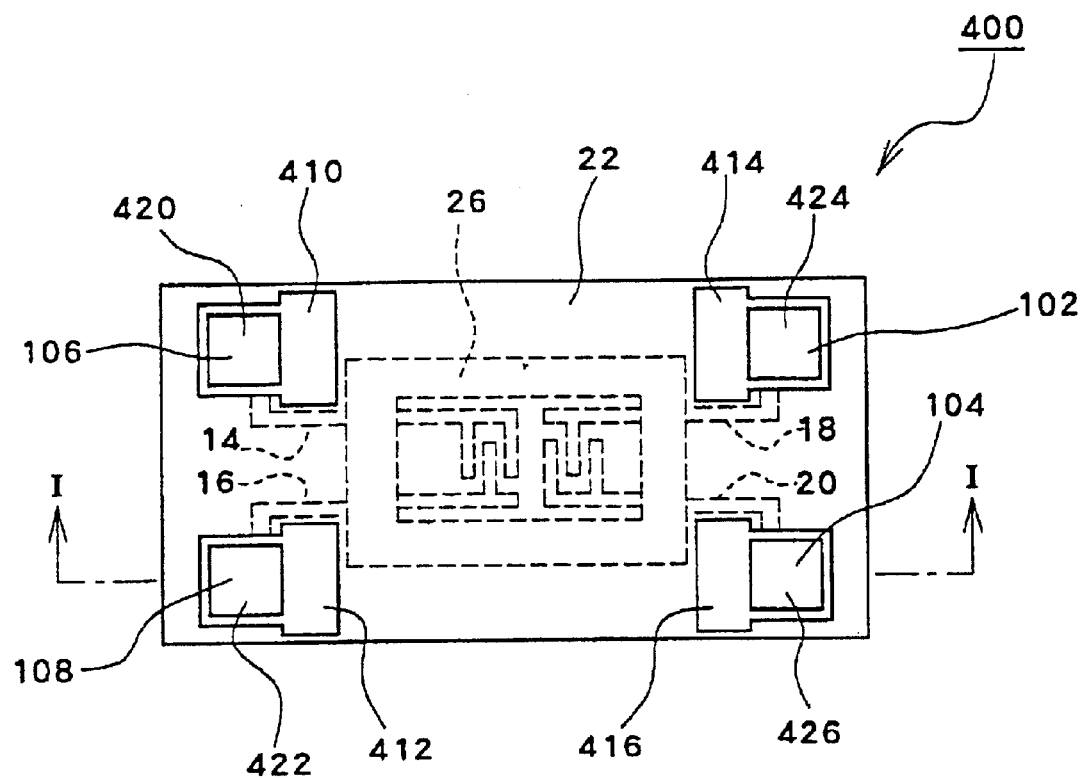
FIG. 12A is a top plan view of the electronic component connected to the circuit board by way of another electrically conductive member.
Figure 12B:
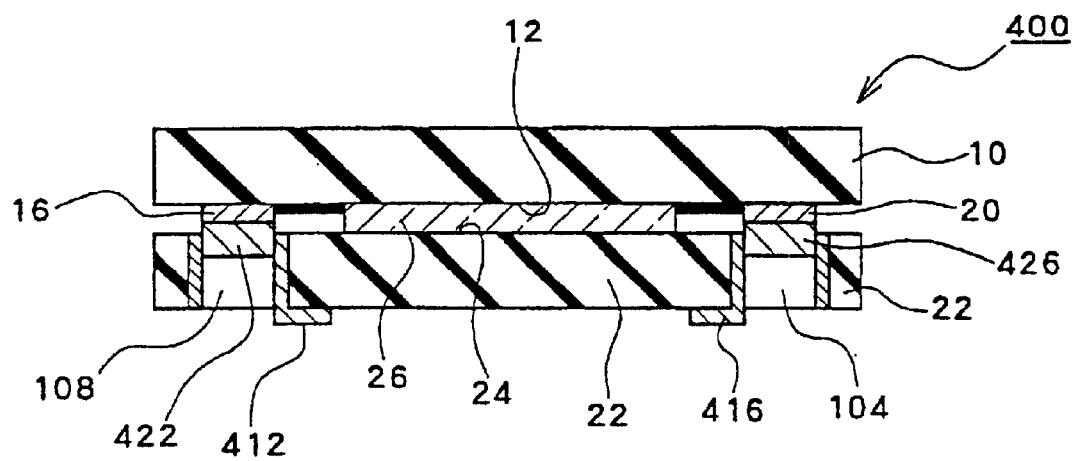
FIG. 12B is a sectional view of the same taken along a line I—I of FIG. 12A.
Figure 13:
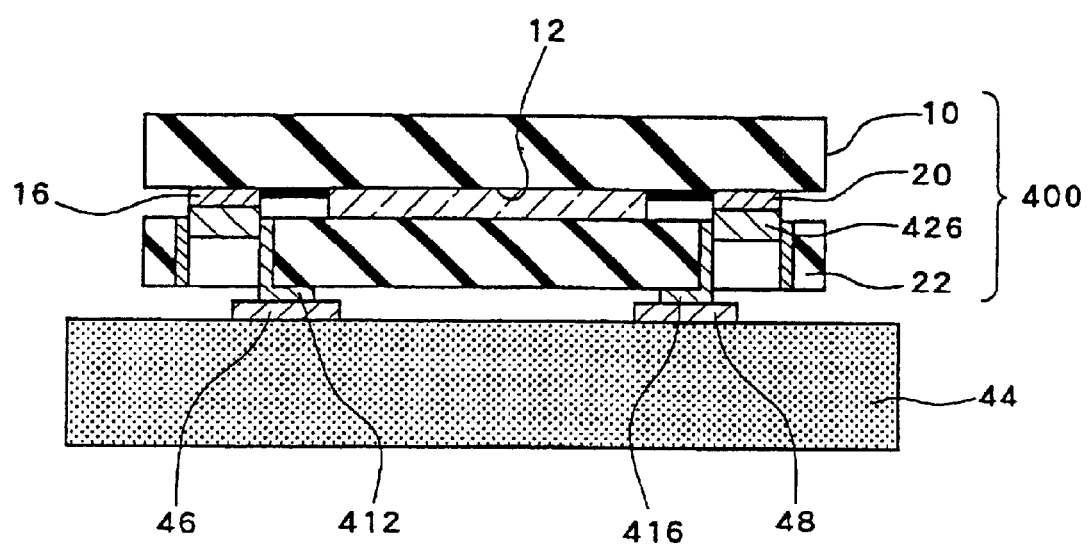
FIG. 13 is a sectional view of an electronic component 400 being mounted on a circuit board 44.

Although the electronic components of the above embodiments have employed the bumps for the connection between the electronic components and the circuit board, the bumps need not necessarily be used, but instead any other electrically conductive members having an electrical conductivity may be used. FIG. 12A is a top plan view of an electronic component 400 connected to a circuit board by way of another electrically conductive member, and FIG. 12B is a sectional view of the same taken along a line I—I of FIG. 12A. The substrate 22 of the electronic component 400 is formed with openings 102, 104, 106 and 108 at positions confronting the electrode pads of the comb-shaped electrodes 14, 16, 18 and 20 of the SAW device. First electrically conductive members 410, 412,414 and 416 are formed on inner walls of the openings 102, 104, 106 and 108 and on the surface of the substrate 22. The first electrically conductive member 412 and the electrode pad of the comb-shaped electrode 16 are connected to each other by way of a second electrically conductive member 422 that is filled into the associated opening. Similar to the first electrically conductive member 412, the remaining first electrically conductive members 410, 414 and 416 are electrically and physically connected with second electrically conductive members 420, 424 and 426 that are filled into the associated openings. FIG. 13 is a sectional view of the electronic component 400 being mounted on the circuit board 44. The electronic component 400 is mounted on the circuit board 44 with the first electrically conductive members 410, 412, 414 and 416 soldered onto the electrodes 46, 48, etc., on the circuit board 44.

Figure 14:
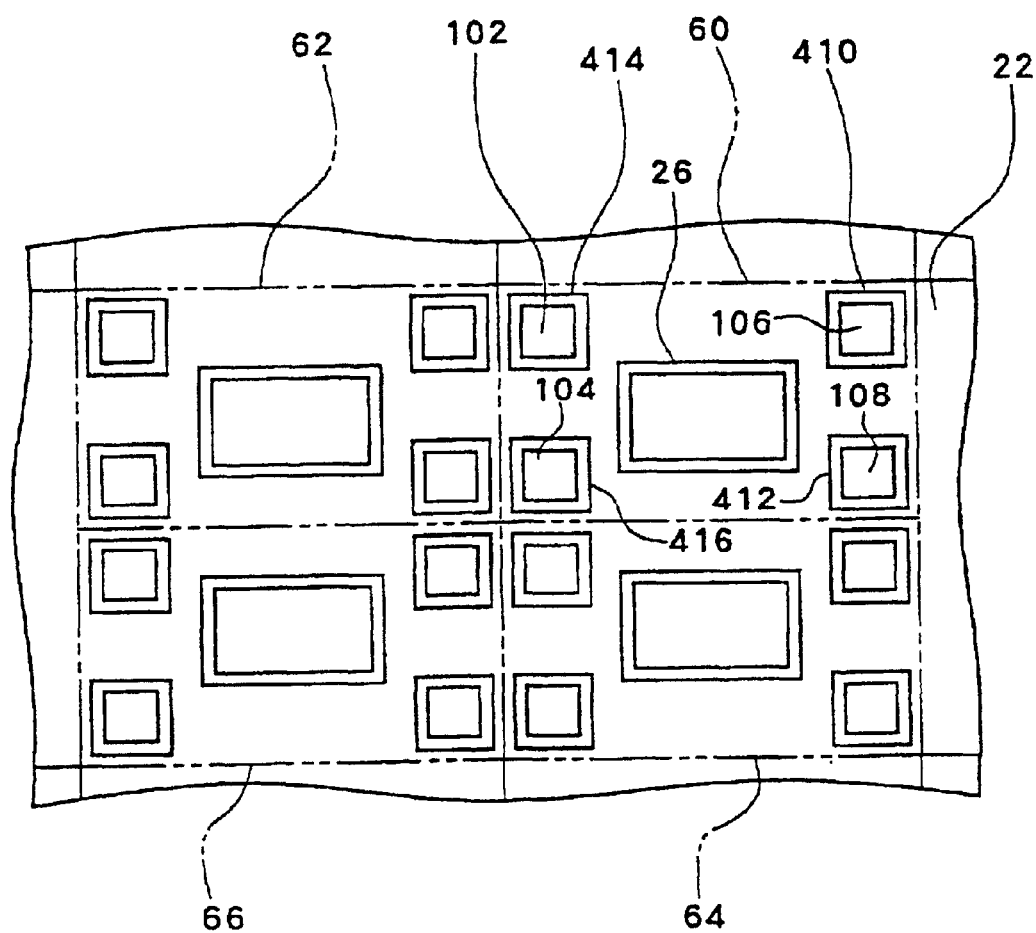
FIG. 14 is a top plan view, viewed from the sealing wall forming side, of the pre-assembled substrate 22 upon the manufacture of the electronic component 400.
Figure 15:
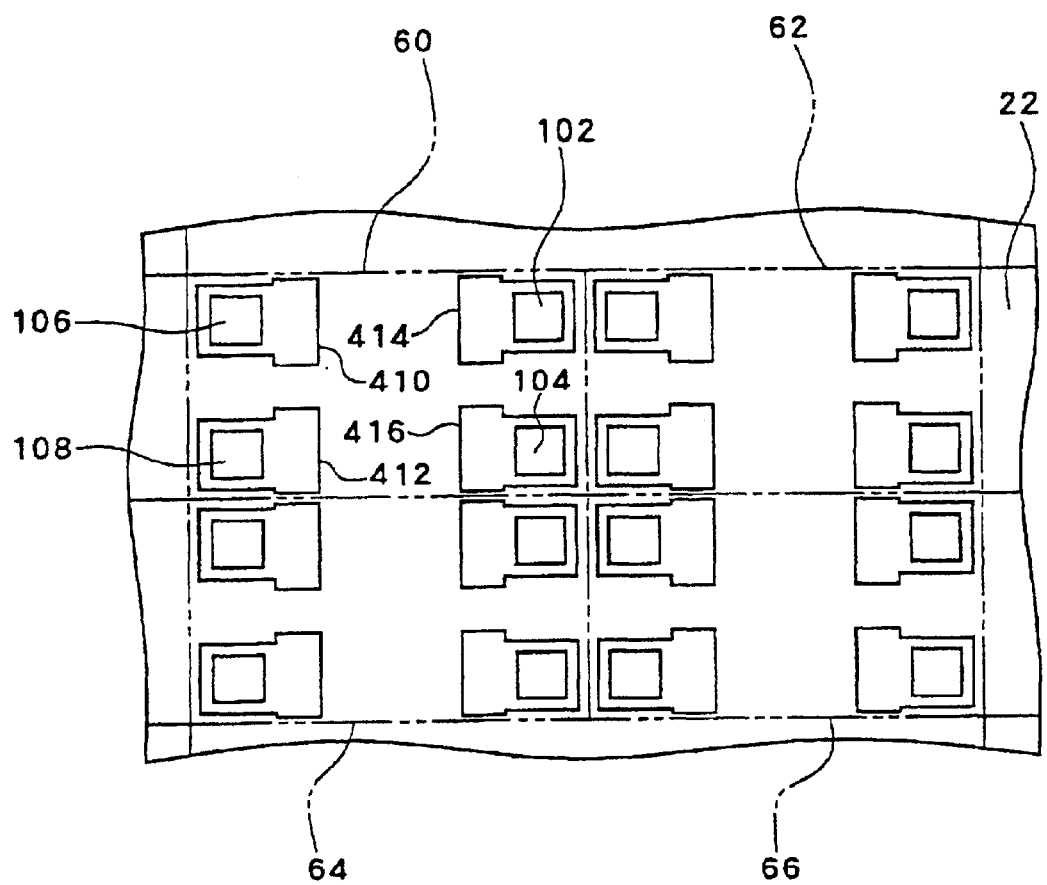
FIG. 15 is a top plan view of the substrate 22 when viewed from the opposite side to the sealing wall forming surface of the substrate 22.
Figure 16:
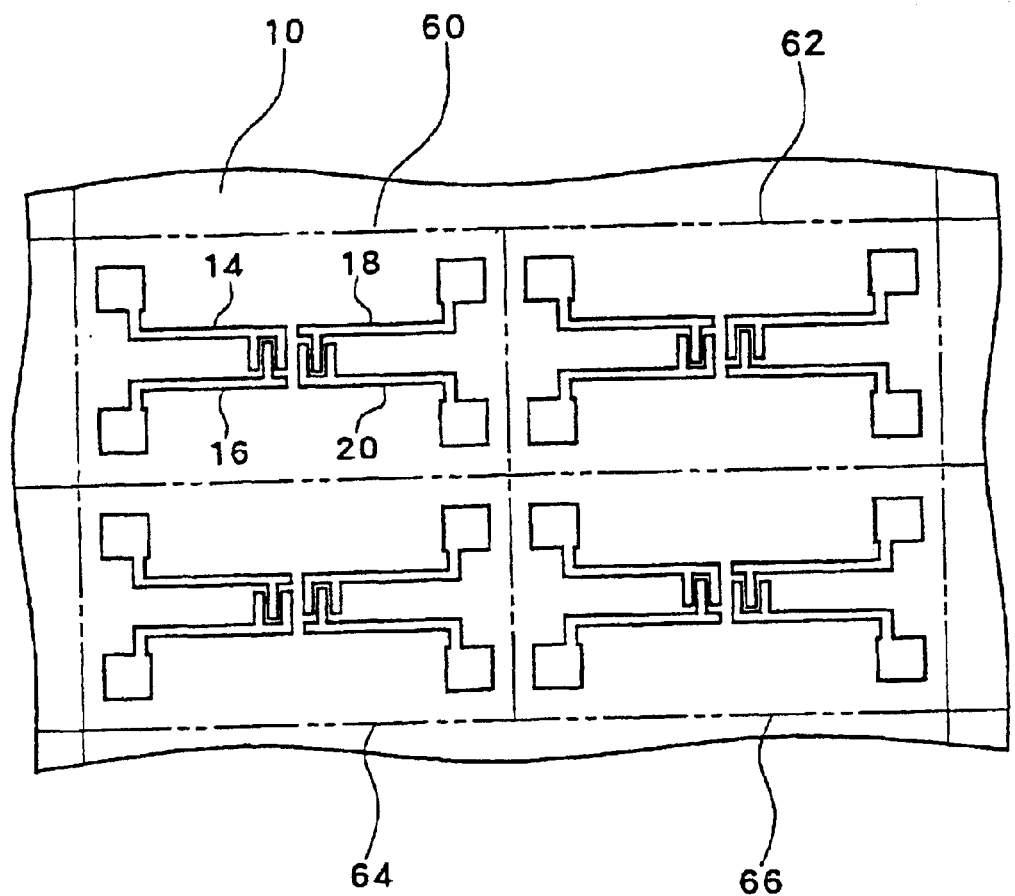
FIG. 16 is a top plan view of the substrate 10 to which the sealing wall of the substrate 22 is closely adhered upon manufacture of the electronic component 400.

FIG. 14 is a top plan view, viewed from the sealing wall forming side, of the pre-assembled substrate 22 upon the manufacture of the electronic component 400. FIG. 15 is a top plan view of the substrate 22 when viewed from the opposite side to the sealing wall forming surface of the substrate 22. FIG. 16 is a top plan view of the substrate 10 to which is closely adhered the sealing wall of the substrate 22 shown in FIGS. 14 and 15. The openings 102, 104, 106 and 108 are formed in a circuit region 60 on the substrate 22. The first electrically conductive members 414, 416, 410 and 412 are formed on the inner walls of the openings 102, 104, 106 and 108. Other circuit regions 62, 66 and 64 are similarly provided with the openings and the first electrically conductive members. After close adhesion of the sealing wall 26 of the substrate 22 to the substrate 10, the second electrically conductive members 420, 422, 424, 426, etc., are filled through the openings associated therewith. Afterward, the substrate 22 and the substrate 10 are severed for each circuit region to manufacture a plurality of electronic components having the same configuration as the electronic component 400.

Figure 17A:
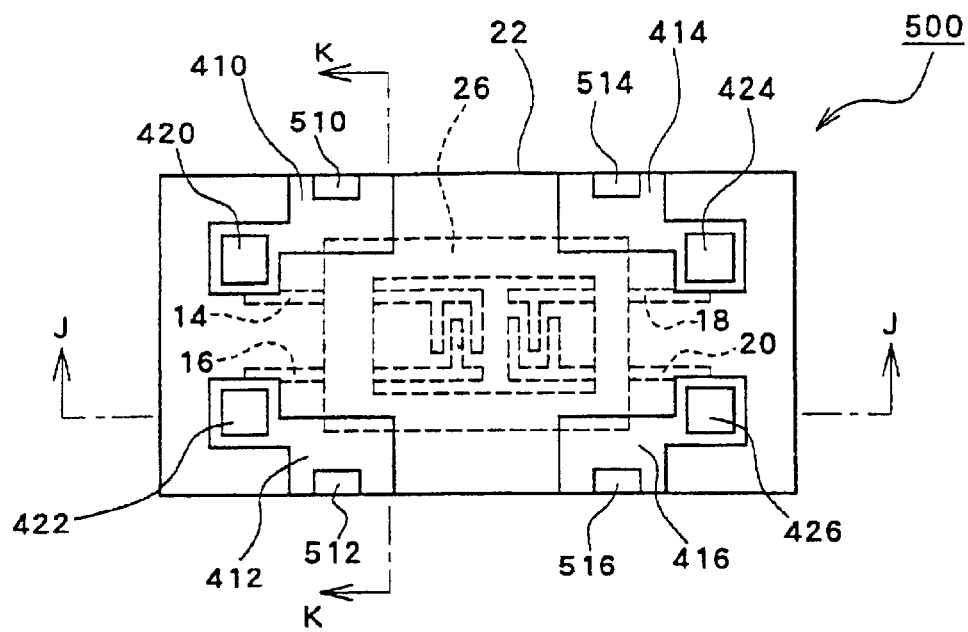
FIG. 17A is a top plan view of an electronic component 500 having openings formed in its side surfaces.
Figure 17B:
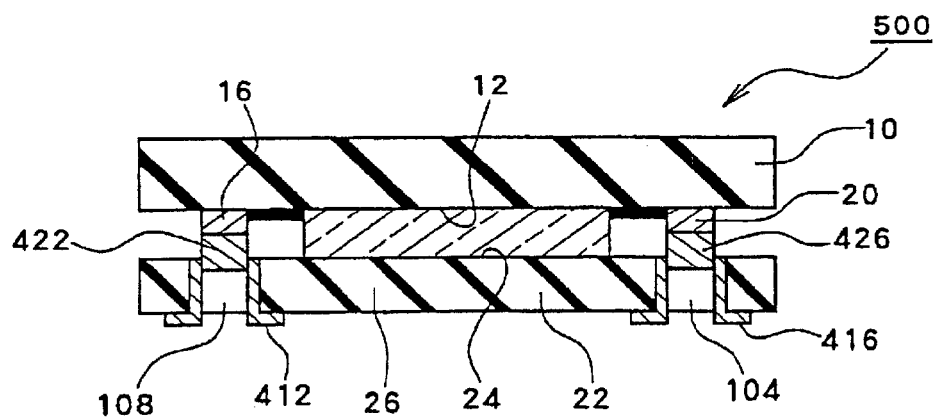
FIG. 17B is a sectional view of the same taken along a line J—J of FIG. 17A.
Figure 17C:
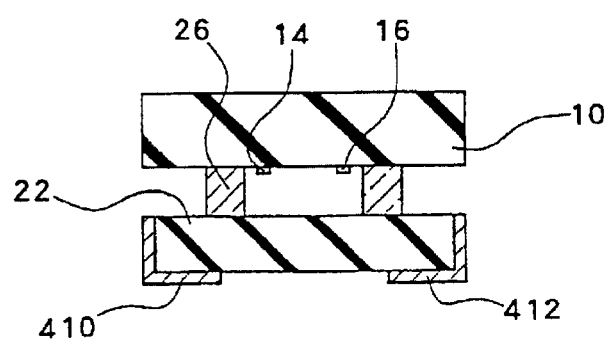
FIG. 17C is a sectional view of the same taken along a line K—K of FIG. 17A.
Figure 18:
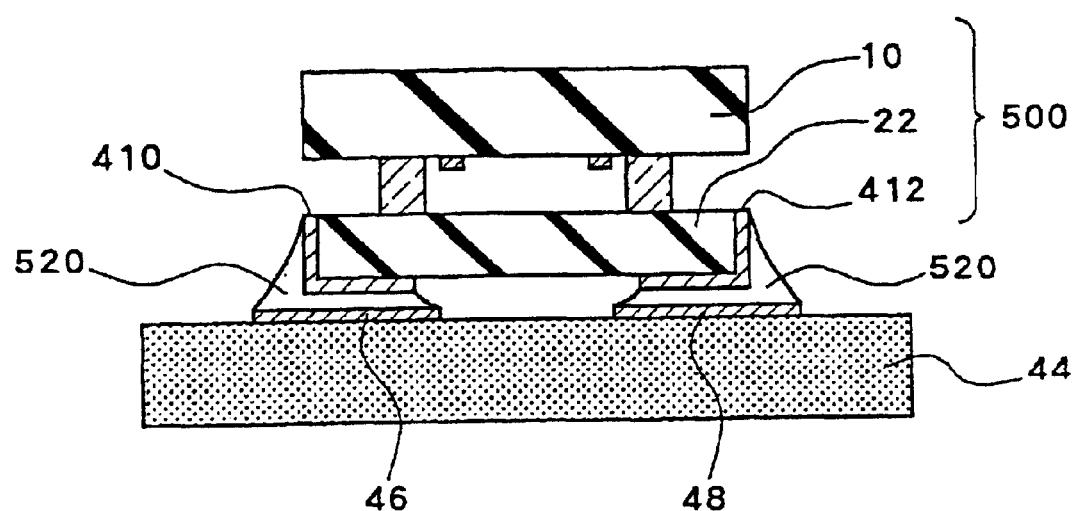
FIG. 18 is a sectional view of an electronic component 500 being mounted on the circuit board 22.

Provision of the additional openings in the side surfaces of the electronic component 400 can enhance the reliability of connection between the circuit board 44 and the electronic component 400. FIG. 17A is a top plan view of an electronic component 500 having openings formed in its side surfaces; FIG. 17B is a sectional view of the same taken along a line J—j of FIG. 17A; and FIG. 17C is a sectional view of the same taken along a line K—K of FIG. 17A. openings 510, 512, 514 and 516 are formed in the side surfaces of the substrate 22. The second electrically conductive member 410 extends over the inner wall of the opening 510 in the side surface and over the side of the substrate 22 in which the opening 510 is formed. In the same manner, the second electrically conductive members 412, 414 and 416 extend over the inner walls of the openings 512, 514 and 516 and over the sides of the substrates 22 in which the opening are formed. FIG. 18 is a sectional view of the electronic component 500 being mounted on the circuit board 44. By virtue of the provision of the second electrically conductive members 410 and 412 on the side surfaces of the substrate 22 of the electronic component 500, it is possible to form solder fillets 520 on the side surfaces of the substrate 22, allowing the reliability of connection between the substrate 22 and the circuit board 44 to be enhanced.

Figure 19:
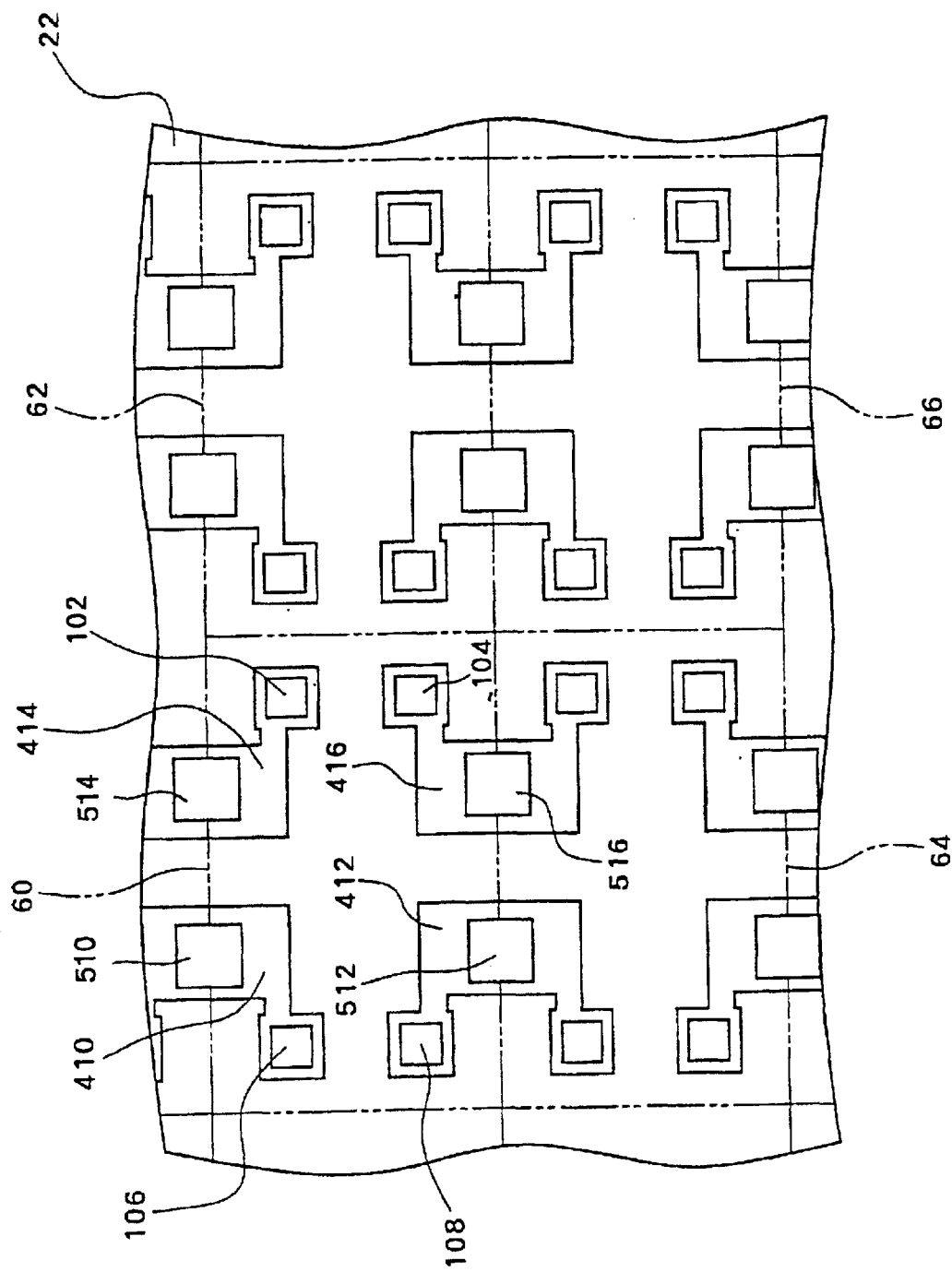
FIG. 19 is a top plan view of the substrate 22 in the pre-assembled state upon the manufacture of the electronic component 500, when viewed from the opposite side to the sealing wall forming surface.
Figure 20A:
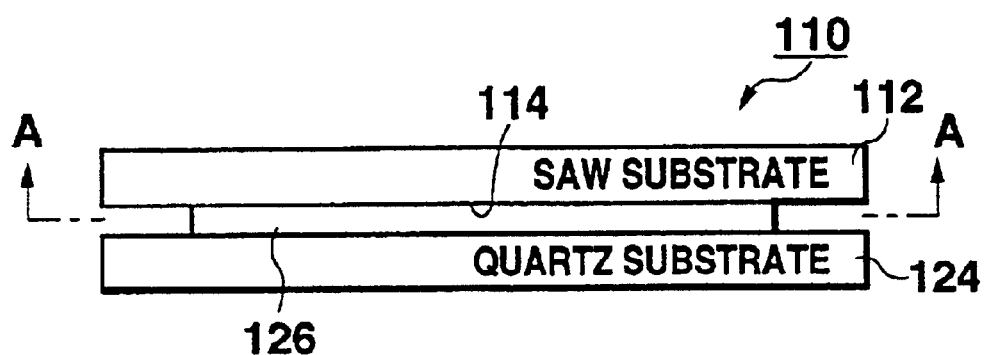
FIG. 20A is a side elevational view of a conventional electronic component.
Figure 20B:
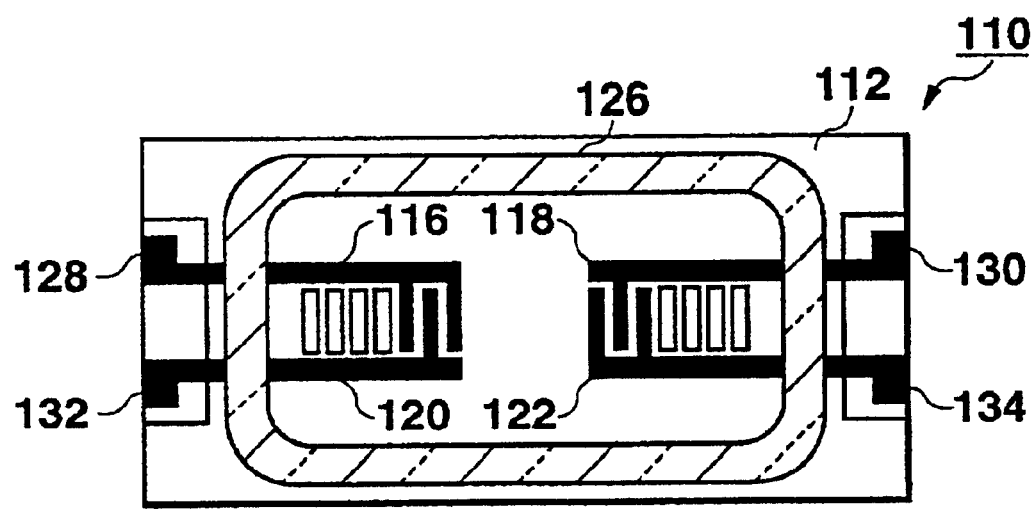
FIG. 20B is a sectional view of the conventional electronic component shown in FIG. 12, taken along a line A—A of FIG. 12A.

FIG. 19 is a top plan view of the substrate 22 in the pre-assembled state of the electronic component 500, when viewed from the opposite side to the surface on which the sealing wall 26 is formed. The circuit region 60 of the substrate 22 is formed with the openings 102, 104, 106, 108, 510, 512, 514 and 516. The first electrically conductive member 414 is formed on the inner wall of the opening 102 so as to extend up to the inner wall of the opening 514. Similarly, the first electrically conductive members 410, 412 and 416 are formed on the inner walls of the openings 104, 106 and 108, respectively. Other circuit regions have the same configuration as that of the circuit region 60. After intimate adhesion of the sealing wall 26 of the substrate 22 to the substrate 10 shown in FIG. 16, the second electrically conductive members 420, 422, 424 and 426, etc., are filled through the associated openings. Afterward, the substrate 22 and the substrate 10 are severed together for each circuit region, to produce a plurality of electronic components each having the same configuration as the electronic component 500. Thus, due to such a feature that the second electrically conductive members are formed on the side surfaces of the substrate 22, it is possible for the electronic component 500 to achieve a secure connection between the substrate 22 and the circuit board 44.

In the electronic components 400 and 500, the substrate 22 may be a multi-layer substrate having a layered structure consisting of an insulating layer(s) made of an insulating material and an electrically conducting layer(s) made of an electrically conductive material, with the substrate 22 carrying thereon one or more circuit elements such as inductors, capacitors, resistors, etc.

In the electronic components of the embodiments, as set forth hereinabove, the electronic circuit devices are hermetically sealed in the electronic component by the sealing wall 26, the substrate 10 and the substrate 22, and the resultant electronic component is mounted on the circuit board 44. As a result, there is no need for any special packages for sealing the electronic circuit devices, thus making it possible to reduce the number of parts and to provide inexpensive electronic components. Furthermore, the electronic components of the embodiments enable gases which may be generated upon the intimate adhesion of the sealing walls to be effectively removed through the openings in the substrate 22.

Although the sealing wall 26 is formed on the substrate 22, it may be provided on the substrate 10.

It is preferred that the substrates 10 and 22 be made of the same material. In this event, there arises only a small difference in the coefficient of thermal expansion between the substrates 10 and 22 when the sealing wall 26 is adhered to the substrate 10 by pressing the sealing wall 26 against the substrate 10 while heating the same, whereupon the thermal stress applied to the sealing wall 26 becomes small, ensuring a good adhesion of the sealing wall 26 to the substrate 10.

Since the electronic component is connected via the bumps to the circuit board in this manner, the area occupied by the electronic component on the circuit board is reduced compared with the conventional electronic component using the bonding wires for the connection to the circuit board, and thus high density mounting becomes feasible. Moreover, due to the fact that no packages of ceramics or the like are used, the number of parts is reduced, making it possible to provide inexpensive electronic components.

In addition, the second substrate of the electronic component is provided with openings at positions in registration with the bumps. These openings can be used to effectively remove gas which may be generated when the sealing wall on the second substrate is adhered to the first substrate.

While illustrative and presently preferred embodiments of the present invention have been described in detail herein, it is to be understood that the inventive concepts may be otherwise variously embodied and employed and that the appended claims are intended to be construed to include such variations except insofar as limited by the prior art.

What is claimed is:

1. A method of manufacturing an electronic component to be mounted on a circuit board, said electronic component comprising:
a first substrate having an electronic circuit device and an electrode pad on one main surface of said first substrate in electrical connection with said electronic circuit device;
a sealing wall whose one face is closely adhered to said one main surface of said first substrate, said sealing wall being configured, to enclose said electronic circuit device with said electrode pad arranged outside of said sealing wall;
a second substrate closely adhered to the other face of said sealing wall;
an opening formed in said second substrate at a site confronting said electrode pad; and
an electrically conductive member extending through the interior of said opening for allowing said electrode pad and said circuit substrate to be electrically connectable to each other;
said method comprising:
a first step in which one faces of a plurality of sealing walls are closely adhered to one main surface of said first substrate which has a plurality of electronic circuit devices formed on said one main surface in a plurality of circuit regions and a plurality of electrode pads in electric connection with said plurality of electronic circuit devices, said plurality of sealing walls each configured to enclose each of said plurality of electronic circuit devices with each of said plurality of electrode pads arranged outside of each of said plurality of sealing walls, and in which said second substrate is closely adhered to the other faces of said plurality of sealing walls, said second substrate having a plurality of openings at sites confronting said plurality of electrode pads said plurality of sealing walls are closely adhered to said first substrate after formation of said plurality of sealing walls onto said second substrate,
a second step in which an electrically conductive member is formed on each of said plurality of electrode pads, said electrically conductive member, being electrically connected with each of said plurality of electrode pads; and
a third step in which said first substrate, together with said second substrate, is severed for each of said plurality of circuit regions, to obtain a plurality of electronic components.

2. A method of manufacturing an electronic component according to claim 1, wherein
said second step includes a step in which said electrically conductive member is formed on each of said plurality of electrode pads through a corresponding one of said plurality of openings.

3. A method of manufacturing an electronic component according to claim 1, wherein
said electrically conductive member comprises a bump.

4. A method of manufacturing an electronic component according to claim 1, wherein
a first electrically conductive member is formed on an inner wall of each of said plurality of openings, said first electrically conductive member being electrically connectable to said circuit board, and wherein
said second step includes a step in which, a second electrically conductive member is formed on each of said plurality of electrode pads, said second electrically conductive member electrically connecting said first electrically conductive member and each of said plurality of electrode pads.

5. A method of manufacturing an electronic component according to claim 1, wherein
said second step is carried out after said first step.

6. A method of manufacturing an electronic component to be mounted on a circuit board, said electronic component comprising:

a first substrate having an electronic circuit device and an electrode pad on one main surface of said first substrate in electrical connection with said electronic circuit device;

a sealing wall whose one face is closely adhered to said one main surface of said first substrate, said sealing wall being configured, to enclose said electronic circuit device with said electrode pad arranged outside of said sealing wall;

a second substrate closely adhered to the other face of said sealing wall;

an opening formed in said second substrate at a site confronting said electrode pad; and an electrically conductive member extending through the interior of said opening for allowing said electrode pad and said circuit substrate to be electrically connectable to each other, said electrically conductive member comprises: a first bump disposed on each of said plurality of electrode pads for electrical connection with said each of said plurality of electrode pads; and a second bump disposed on top of said first bump for electrical and physical connection with said circuit board;

said method comprising:

a first step in which one faces of a plurality of sealing walls are closely adhered to one main surface of said first substrate which has a plurality of electronic circuit devices formed on said one main surface in a plurality of circuit regions and a plurality of electrode pads in electric connection with said plurality of electronic circuit devices, said plurality of sealing walls each configured to enclose each of said plurality of electronic circuit devices with each of said plurality of electrode pads arranged outside of each of said plurality of sealing walls, and in which said second substrate is closely adhered to the other faces of said plurality of sealing walls, said second substrate having a plurality of openings at sites confronting said plurality of electrode pads said plurality of sealing walls are closely adhered to said first substrate after formation of said plurality of sealing walls onto said second substrate, a second step in which an electrically conductive member by forming said first bump on each of said plurality of electrode pads through a corresponding one of said plurality of openings, after which said second bump is formed on top of said first bump, said electrically conductive member, being electrically connected with each of said plurality of electrode pads; and;

third step in which said first substrate, together with said second substrate, is severed for each of said plurality of circuit regions, to obtain a plurality of electronic components.

7. A method of manufacturing an electronic component according to claim 6, wherein said first step includes a step in which said plurality of sealing walls are closely adhered to said second substrate after formation of said plurality of sealing walls onto said first substrate.

* * * * *

UNITED STATES PATENT AND TRADEMARK OFFICE
CERTIFICATE OF CORRECTION

| | |
|---|---|
| PATENT NO. | : 6,815,313 B2 |
| APPLICATION NO. | : 10/033397 |
| DATED | : November 9, 2004 |
| INVENTOR(S) | : Hiromi Yatsuda |

Page 1 of 1

It is certified that error appears in the above-identified patent and that said Letters Patent is hereby corrected as shown below:

Please correct claim 1, column 12, lines 2 through 3 as follows:

"said sealing wail being configured" delete "wail" and replace with

--said sealing wall being configured--

Signed and Sealed this

First Day of July, 2008

JON W. DUDAS
*Director of the United States Patent and Trademark Office*